United States Patent [19]
Maruyama et al.

[11] Patent Number: 6,115,175
[45] Date of Patent: *Sep. 5, 2000

[54] UV IMAGE FORMING OPTICAL SYSTEM

[75] Inventors: Koichi Maruyama; Makoto Iwaki; Syunitirou Wakamiya; Shigeo Kubota; Hiroshi Suganuma; Minoru Takeda, all of Tokyo, Japan

[73] Assignee: Asahi Kogaku Kogyo Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/577,160

[22] Filed: Dec. 22, 1995

[30]     Foreign Application Priority Data

Dec. 22, 1994 [JP] Japan .................................. 6-321033

[51] Int. Cl.[7] ........................... G02B 13/14; G02B 11/00; G01B 11/00
[52] U.S. Cl. .......................... 359/355; 359/350; 359/642; 356/359; 356/360
[58] Field of Search .................................... 356/345, 352, 356/353, 357, 359, 360; 359/353, 355, 360, 583; 250/227.27

[56]     References Cited

U.S. PATENT DOCUMENTS

| | | | |
|---|---|---|---|
| 4,844,617 | 7/1989 | Kelderman et al. | 356/372 |
| 5,210,891 | 5/1993 | DeGroot | 356/357 |
| 5,500,767 | 3/1996 | Maruyama et al. | 359/642 |
| 5,583,696 | 12/1996 | Takahashi | 359/637 |
| 5,646,778 | 7/1997 | Shuman | 359/583 |

*Primary Examiner*—Audrey Chang
*Attorney, Agent, or Firm*—Greenblum & Bernstein, P.L.C.

[57]     ABSTRACT

A UV image forming optical system includes a collimating lens for collimating light emitted from a UV light source, an imaging lens for forming an image of the collimated light transmitted through the collimating lens, and a beam splitting optical system positioned in an optical path of the collimated light between the collimating lens and the imaging lens. At least one of the collimated light emitted from the collimating lens and the light transmitted through the imaging lens, reflected by a reflector and transmitted again through the imaging lens is made incident upon an external viewing optical system.

13 Claims, 6 Drawing Sheets

UV IMAGE FORMING OPTICAL SYSTEM

BACKGROUND OF THE INVENTION

1. Field of the Invention

The present invention relates to an optical system for projecting and forming a reduced size of an image of a fine pattern on a wafer using UV radiation as a light source.

2. Description of Related Art

In an image projecting system which reduces and projects a fine pattern of an integrated circuit (IC) or a large-scale integrated circuit (LSI), etc., onto a semiconductor substrate, UV radiation (light in the UV region), such as that emitted by an excimer laser, has been widely used in response to a demand to shorten the wavelength of light to be used in order to increase the density of the integrated circuit.

Conventional optical glass can not be incorporated in a UV optical system since the transmittance of conventional optical glass for visible light is insufficient for UV radiation. To this end, a lens made of quartz (SiO2) or fluorite ($CaF_2$) which has a high UV transmittance is usually used instead of a conventional glass lens. However, a quartz or fluorite lens must be produced with high precision. Another problem is that it is difficult to correct aberrations caused in the lens, and difficult to evaluate the optical performance of the lens in manufacture, assembly or use. Namely, in a UV projecting optical system, which is provided to form an image that is diffraction-limited, the amount of aberrations remaining in the optical system must be decreased in proportion to the wavelength. To this end, it is necessary to enhance the production precision of the lens, for example, reducing profile irregularities, and adjusting the lens to improve precision. These two points are far more important for a lens for UV radiation, than a glass lens for visible light. In particular, if a highly precise adjustment can be carried out, the level of production precision would be reduced to some extent, thus facilitating the production of UV lenses.

SUMMARY OF THE INVENTION

The primary object of the present invention is to provide a UV image forming optical system in which the optical property of a lens can be easily evaluated in manufacture, assembly or use.

According to the present invention, there is provided a UV image forming optical system including a collimating lens which collimates light emitted from a UV light source, an imaging lens which forms an image of the collimated UV light beams transmitted through the collimating lens, and a beam splitting optical system which is provided in an optical path of the collimated light beams, and between the collimating lens and the imaging lens. At least one of the collimated light beams emitted from the collimating lens and the light transmitted through the imaging lens, reflected by a reflector, and transmitted back through the imaging lens, is made incident upon an external viewing optical system.

In this UV image forming optical system, focusing can be carried out by moving only the imaging lens.

The beam splitting optical system can be include of an interferometer in which the collimated light beams emitted from the collimating lens interfere with the light transmitted through the imaging lens and reflected by the reflector to form interference fringes. With this arrangement, the assembly or the adjustment can be carried out while the aberrations of the imaging lens are observed.

The beam splitting optical system can include of a substantially parallel-plane plate on which one of the opposed surfaces, with a semi-transparent surface, and the other opposed surface includes an anti-reflection surface. The substantially parallel-plane plate is located in the optical path between the collimating lens and the imaging lens at a predetermined inclination angle with respect to the optical axis thereof.

When the substantially parallel-plane plate is positioned in the optical path between the collimating lens and the imaging lens, the optical axis of the collimating lens is deviated from the optical axis of the imaging lens, in a parallel direction. This deviation, corresponding to a displacement of the optical axis of the light, is caused by the substantially parallel-plane plate.

The substantially parallel-plane plate is preferably provided with opposed front and rear surfaces that are not perfectly parallel but are slightly inclined at -a small inclination angle to form a wedge.

The light transmitted through the imaging lens and reflected by the reflector is split by the beam splitting optical system, so that the imaging lens may be moved relative to the reflector in the optical axis direction. The movement is based on image point data of the imaging lens obtained through the reflected light, to carry out a focus adjustment.

The beam splitting optical system can include a light gathering lens which gathers the collimated light beams emitted from the collimating lens and the light reflected by the reflector, and a spatial filter located in the vicinity of a rear focal point of the light gathering lens.

Preferably, the beam splitting optical system includes of a rotatable reflecting member which changes the direction of one of the collimated light beams emitted from the collimating lens and the light reflected by the reflector.

Preferably, a photosensitive member and a reflecting spherical surface whose center of curvature is located on a focal plane of the imaging lens or which is provided with a reflecting surface to be located within the focal plane of the imaging lens can be interchangeably provided at the focal plane of the imaging lens. Similarly, a pattern to be reduced and exposed or a pin-hole plate can be interchangeably located at the front focal point of the collimating lens. The reflecting spherical surface is preferably movable while maintaining the center of curvature thereof within the focal plane.

Furthermore, provision is made for an adjusting viewing lens which is adapted to make the focus of the light gathering lens correspond with an image pickup surface of a video camera.

According to another aspect of the present invention, there is provided a UV image forming optical system including a collimating lens which collimates light beams emitted from a UV light source, an imaging lens which forms an image of the collimated UV light transmitted through the collimating lens, and an interferometer which is provided in an optical path of the collimated light and between the collimating lens and the imaging lens. The collimated light emitted from the collimating lens interferes with the light transmitted through the imaging lens and reflected by the reflector forming interference fringes. The interferometer can include of a substantially parallel-plane plate on which one of the opposed surfaces includes a semi-transparent surface, and the other opposed surface includes an anti-reflection surface. The substantially parallel-plane plate is located in the optical path between the collimating lens and the imaging lens at a predetermined inclination angle with respect to the-optical axis thereof.

Preferably, a rotatable reflecting member is provided which changes the direction of one of the collimated light emitted from the collimating lens and the light reflected by the reflector.

A light gathering lens is also provided which gathers the collimated light emitted from the collimating lens and the light reflected by the rotatable reflecting member.

A spatial filter is located in the vicinity of a rear focal point of the light gathering lens, and a pin-hole plate is located at a front focal point of the collimating lens.

A reflecting spherical surface is also provided whose center of curvature is located within a focal plane of the imaging lens or a reflecting surface which is located within the focal plane of the imaging lens.

The present disclosure relates to subject matter contained in Japanese Patent Application No. 6-321033 (filed on Dec. 22, 1994) which is expressly incorporated herein by reference in its entirety.

BRIEF DESCRIPTION OF THE DRAWINGS

The invention will be described below in detail with reference to the accompanying drawings, in which.

DESCRIPTION OF THE PREFERRED EMBODIMENT

Figure 1:
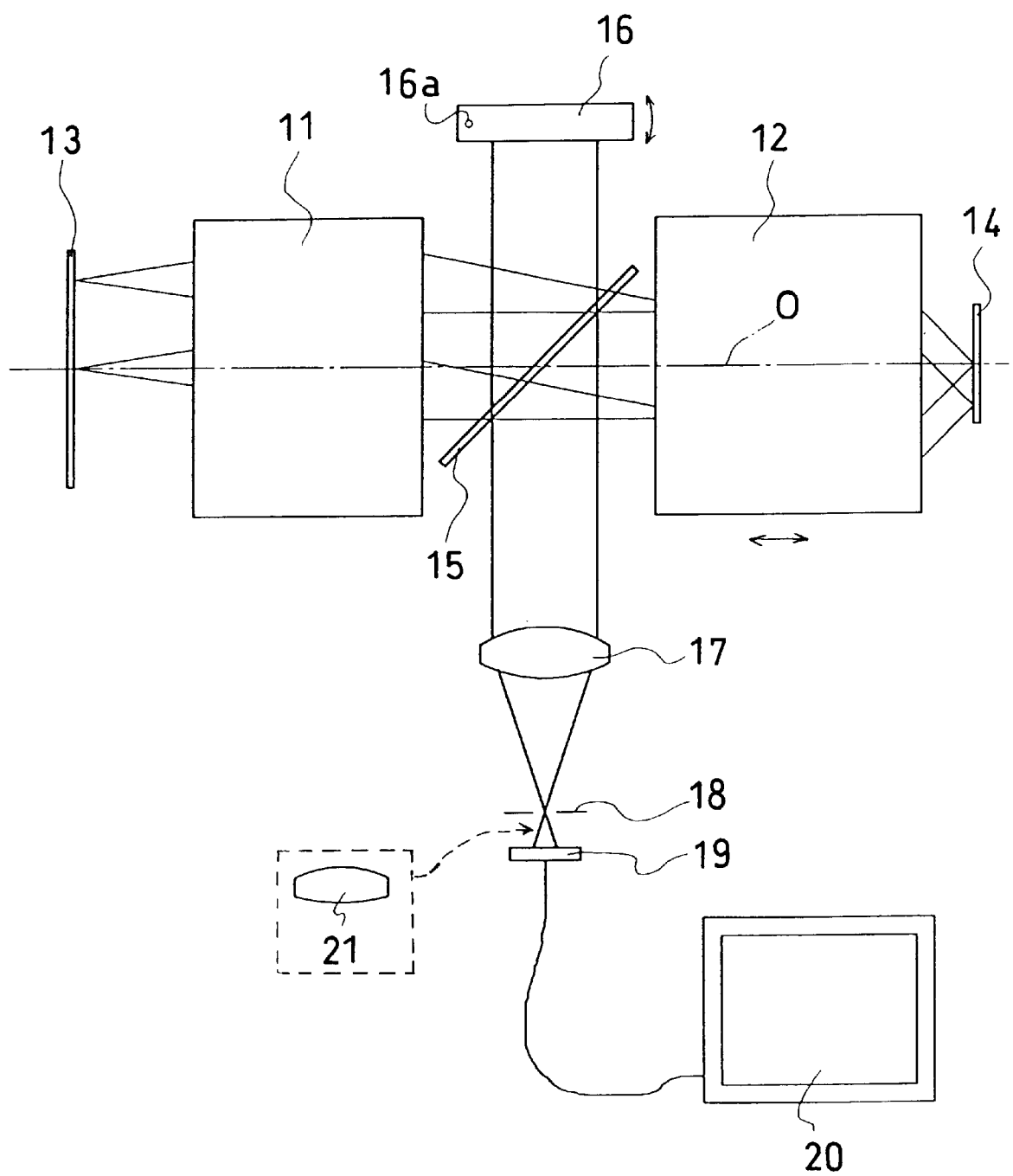
FIG. 1 is a schematic view of a UV image forming optical system.

A UV image forming optical system, as shown in FIG. 1, is comprised of two lenses, i.e., a collimating lens 11 and an imaging lens 12. The collimating lens 11 collimates divergent light emitted from a point on a reticle or chart 13 to be reduced and exposed. The imaging lens 12 receives the collimated light to project a reduced image of the reticle 13 onto a wafer or photoconductive member 14. Between the collimating lens 11 and the imaging lens 12, the rays of light are parallel. In an optical system in which the two lenses are separated from each other by a region in which light rays are parallel, no change in magnification occurs when only the imaging lens is moved upon focusing. When the present optical system is applied to a stepper, one of the most significant features is the stability of the image magnification, i.e., no change in magnification occurs during focusing or due to the wafer 14 having a fine stepped portion (caused by an unintentional positional deviation).

The aberrations of not only the collimating lens 11, which emits collimated light, but also the imaging lens 12, which receives the collimated light, are corrected such that optimal efficiency is obtained when the parallel rays of light are made incident at an infinite object distance. Consequently, no change in aberrations occurs when the imaging lens 12 moves.

Since focusing can be carried out only by the movement of the imaging lens 12, the focusing mechanism can be simplified, in comparison with a conventional UV image forming optical system in which focusing is carried out by moving the whole lens system. Instead of moving the imaging lens 12 relative to the wafer 14, it is theoretically possible to move the wafer 14 relative to the imaging lens 12. However, this is not desirable in practice, since the wafer 14 is already provided with a moving mechanism which moves it in a direction perpendicular to the optical axis to repeatedly expose the same. Namely, if an additional moving mechanism was used with the wafer 14 to move it in the optical axis direction, the whole moving mechanism would become large and complex.

If the positions of a diaphragm and the focal points of the collimating lens 11 and the imaging lens 12 are determined such that the lenses define a double telecentric lens system, no change in magnification takes place even when the exposure surface is slightly uneven.

The UV image forming optical system of the present invention has a function to reduce the size of an image (reduction magnification). Consequently, the collimating lens 11 which collimates the light emitted from the UV light source has a large image circle and a relatively small NA (numerical aperture), and the imaging lens 12 whose angle of view is the same as that of the collimating lens 11 has a smaller image circle and a relatively large NA, compared with that of the collimating lens. Hence, the remaining wavefront aberrations from the collimating lens 11 and the imaging lens 12 can be easily and precisely measured by using an interferometer.

Generally speaking, it is necessary to provide an interferometer inherent to the associated optical system in order to evaluate the optical performance of the lens whose aberration is not corrected with respect to the collimated light. A general-purpose interferometer can be used to measure the optical performance of a lens whose aberration has been corrected with respect to the collimated light. Since a beam splitting optical system is provided between the collimating lens 11 and the imaging lens 12, for the collimated light in the present invention, a conventional or general-purpose interferometer can be used in the beam splitting optical system to measure the optical performance (optical property), so that the aberration correction or the adjustment of positional deviation can be effected in accordance with the measurement. Namely, according to the present invention, the optical performance of the lenses can be easily measured by a general-purpose interferometer to carry out the adjustment of the lenses, etc., in a UV image forming optical system. In general, the aberrations of the imaging lens 12, having a larger NA, tend to vary more easily than the collimating lens 11. Consequently, it is preferable that assembly and adjustment are carried out while observing the state of the aberrations. To this end, the present invention is aimed at a direct detection or measurement of the aberrations of the imaging lens 12.

A substantially parallel-plane plate (referred to as a parallel plate) 15 is provided between the collimating lens 11 and the imaging lens 12, as shown in FIG. 1. The parallel plate 15 is inclined at an angle of about 45° with respect to the optical axis O. The parallel plate 15 is provided on one of the front or rear surfaces, i.e., the surface 15a (FIG. 5), with a semi-transparent mirror layer and on the other surface 15b with an anti-reflection layer. The parallel plate 15 makes the collimated light emitted from the collimating lens 11 and the light transmitted through the imaging lens 12, reflected by the wafer 14 and transmitted again through the imaging lens 12, incident upon an external viewing system. Namely, the collimated light emitted from the collimating lens 11 is reflected by the parallel plate 15 toward a reference mirror 16, and the light returning from the imaging lens 12 is reflected by the parallel plate 15 in a direction opposite to the reference mirror 16.

If the opposed surfaces (front and rear surfaces) of the parallel plate 15 are perfectly parallel, interference fringes will be produced due to the light being reflected by the front and rear surfaces, thus resulting in an occurrence of a noise upon measurement. The anti-reflection film provided on the surface 15b of the parallel plate 15 contributes to an elimination of the noise to some extent. A slight inclination of the opposed surfaces 15a and 15b of the parallel plate 15 (e.g., a few minutes to several tens of minutes) to form a wedge eliminates the noise. Namely, if the opposed surfaces 15a and 15b are inclined in the form of a wedge, the noise can be easily removed with the help of a spatial filter 18 which will be described hereinafter. If the surfaces 15a and 15b are slightly inclined, the optical axis of the light will be slightly inclined before and after transmission through the parallel plate 15, but no aberration, including an inclination of the image surface, is produced, since the parallel plate 15 is located within the parallel rays of light. Namely, only a minute shift of the position of the image takes place.

Figure 5:
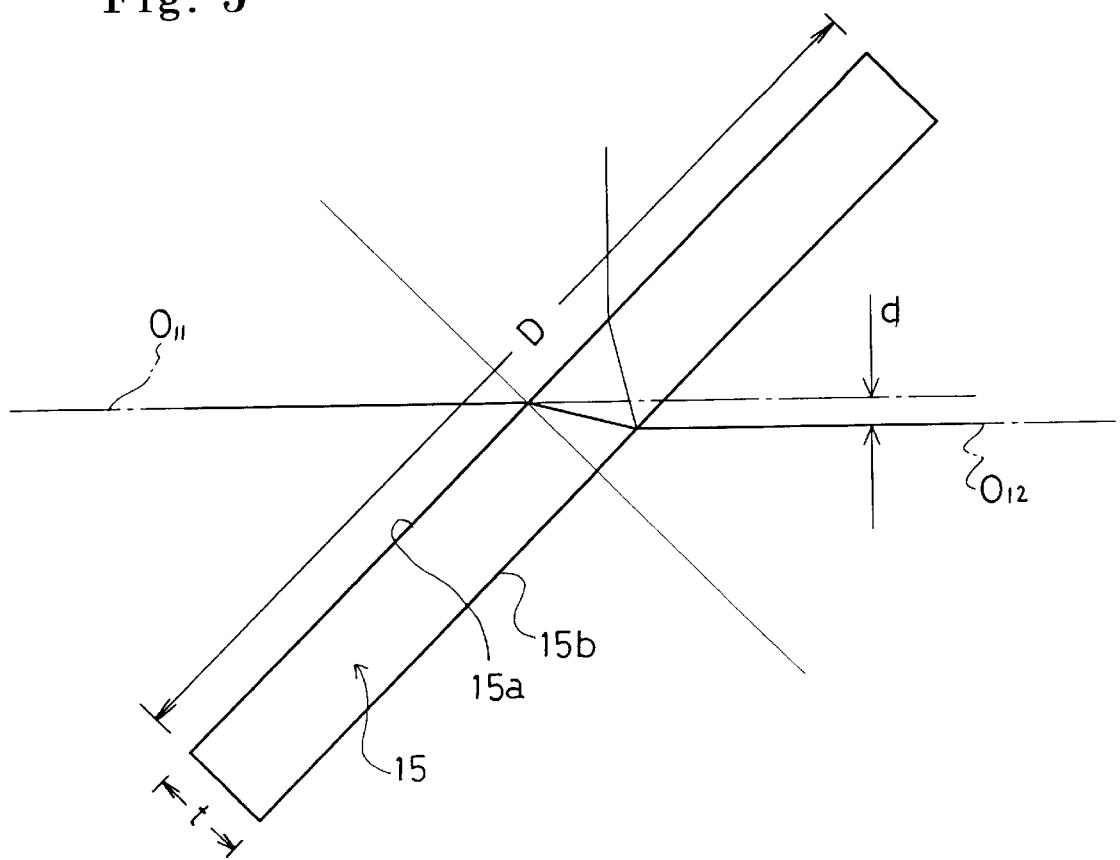
FIG. 5 is an enlarged view of a substantially parallel-plane plate in the UV image forming optical system shown in FIG. 1; and, FIG. 6 is a schematic view of a lens arrangement of a collimating lens, an imaging lens, and a substantially parallel-plane plate in a UV image forming optical system according to an aspect of the present invention.

Since the parallel plate 15 is disposed at a predetermined inclination angle with respect to the optical axis O, a parallel shift of the optical axis occurs when the light passes through the parallel plate 15, as shown in FIG. 5. It is known through experiments that the thickness "t" of the parallel plate 15 must be more than 7% of the diameter "D" thereof to obtain a sufficient surface precision thereof. The parallel shift "d" can be absorbed by the parallel deviation of the optical axis $O_{11}$ of the collimating lens 11 and the optical axis $O_{12}$ of the imaging lens 12 by a deviation corresponding to the parallel shift "d" of the optical axis caused by the parallel plate 15. If the optical axis of the collimating lens 11 is identical to or aligned with the optical axis of the imaging lens 12, in spite of the parallel shift of the light caused by the parallel plate 15, it could be deemed that the entrance pupil or exit pupil of the collimating lens 11 is eccentric with respect to the imaging lens 12. Consequently, there is a possibility that a slightly irregular distribution in the quantity of light is produced within the image surface, or the resolving power will be decreased due to a substantial reduction of the NA, or an anamorphic irregular magnification will be produced due to a collapse of the telecentricity.

A condenser lens or light gathering lens 17, a spatial filter 18 and a video camera 19 are provided on the side of the parallel plate 15 opposite to the reference mirror 16. The video camera 19 is connected to a TV monitor 20. The condenser lens 17, the spatial filter 18 and the video camera 19 constitute an interferometer which measures the wavefront aberration of the imaging lens 12, when the reticle 13 and the wafer 14 are replaced by a pin-hole plate 23 and a plane mirror 24A, a spherical convex mirror 24B, or a spherical concave mirror 24C, respectively, (see, for example, FIGS. 2–4).

The condenser lens 17 condenses two parallel beams of coherent light before they reach the video camera 19. One of the coherent light beam fluxes is emitted from the collimating lens 11, reflected by the parallel plate 15, reflected by the reference mirror 16, and transmitted through the parallel plate 15. The other coherent light beam flux emitted from the collimating lens 11 is transmitted through the parallel plate 15 and the imaging lens 12, reflected by the plane mirror 24A or the spherical concave mirror 24C, transmitted through the imaging lens 12 and reflected by the parallel plate 15. The UV radiation which is not visible is formed as interference fringes in the video camera 19, so that the interference fringes can be viewed through the TV monitor 20.

The spatial filter 18 is located at the rear focal point of the condenser lens 17 or in the vicinity thereof. The two coherent beam fluxes, which are substantially collimated rays of light, are converged in the focal plane of the condenser lens 17 to form beam spots (i.e., small point images). The unnecessary light or noise can be removed by the spatial filter 18, which is provided with a transparent portion in the form of a pin-hole. If a highly coherent light source is used, the light which passes through the imaging lens 12 tends to contain a noise component, since the imaging lens 12 is comprised of a large number of lens elements. The spatial filter 18 can advantageously remove unnecessary light reflected by the parallel plate 15. The spatial filter 18 can be made of a substrate having a transparent portion in the form of a pin-hole and an opaque portion surrounding the transparent portion. Preferably, a slightly transparent diffusion portion is also provided to surround the transparent portion (pin-hole). In order to form an interferometer, it is necessary for the two beam fluxes travelling along different light paths to enter the same pin-hole. To achieve this, it is necessary to adjust the position of the pin-hole. Upon adjusting the position of the pin-hole, or upon adjusting the position of the reference mirror 16 which reflects the light reflected by the parallel plate 15 toward the condenser lens 17, it is necessary to detect the amount (degree) of adjustment through the video camera 19, since the UV radiation is invisible; otherwise, operability would be worse. Relatedly, it is preferable that the pin-hole is surrounded by the diffusion portion, through which light can be partly transmitted, so as to detect any deviation of the light convergent point from the pin hole.

The pin-hole plate 23, the plane mirror 24A, the spherical convex mirror 24B, the spherical concave mirror 24C, and the spatial filter 18 are preferably supported to move or adjust in a direction perpendicular to the optical axis direction to detect the off-axis aberrations of the collimating lens 11 and the imaging lens 12. Namely, the pin-hole plate 23 is moved in the direction perpendicular to the optical axis within the front focal plane of the collimating lens 11; the spatial filter 18 is moved in the direction perpendicular to the optical axis within the focal plane of the condenser lens 17; and, the spherical convex mirror 24B and the spherical concave mirror 24C are moved with their center of curvatures being located in the focal plane of the imaging lens 12.

The reference mirror 16 is rotatable and adjustable about the shaft 16a. Namely, it is necessary to make the two coherent beam fluxes substantially parallel in order to produce the interference fringes. If the reference mirror 16 is rotatable and adjustable about the shaft 16a by the angular displacement corresponding to the angular deviation of the off-axis light from the optical axis, the interferometer can be used also for the off-axis light.

The focal point of the condenser lens 17 and the image pickup surface of the video camera 19 must be conjugate with each other to make the position of the spatial filter 18 coincident with the convergent point of the reflected rays of light to thereby produce interference fringes. To this end, an adjusting view lens 21 is preferably provided and selectively inserted behind the spatial filter 18. In the alternative, the adjusting view lens 21 may be provided in a separate beam splitting optical system (not shown), behind the spatial filter 18. In this arrangement, an additional video camera, for observing the interference fringes, may be used.

Figure 2:
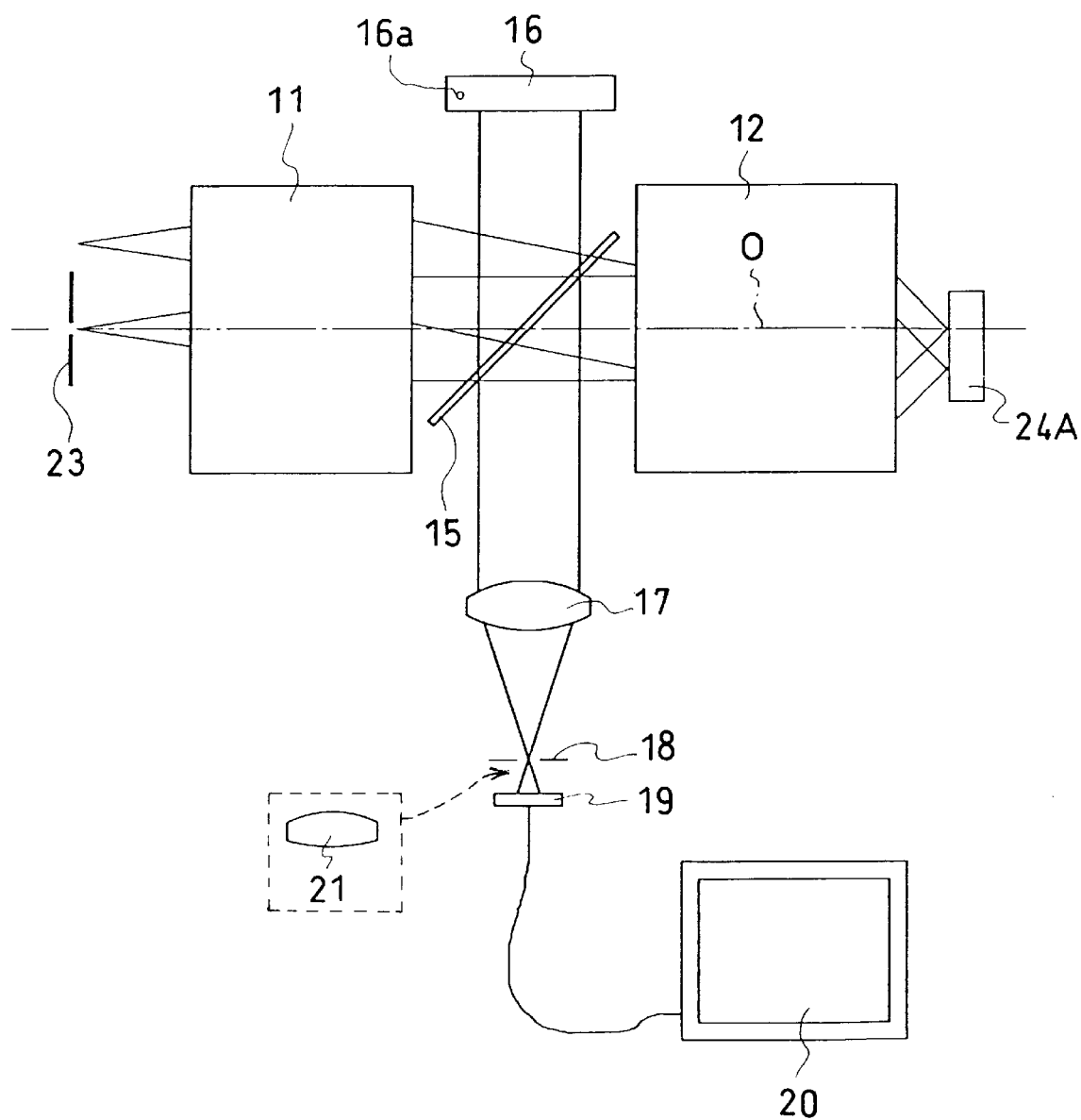
FIG. 2 is a schematic view of a first embodiment of an interferometer in the UV image forming optical system shown in FIG. 1.
Figure 3:
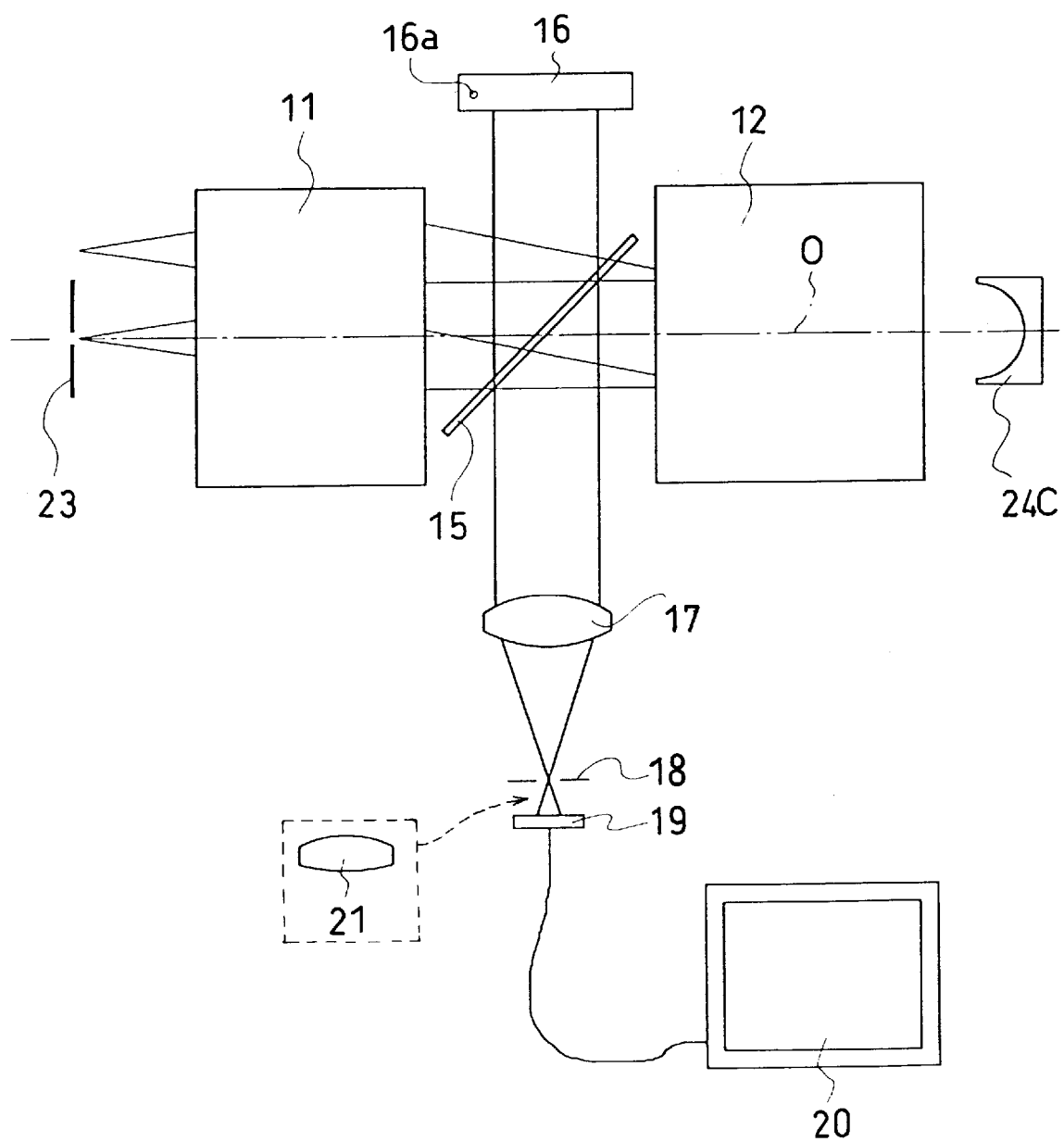
FIG. 3 is a schematic view of a second embodiment of an interferometer in the UV image forming optical system shown in FIG. 1.
Figure 4:
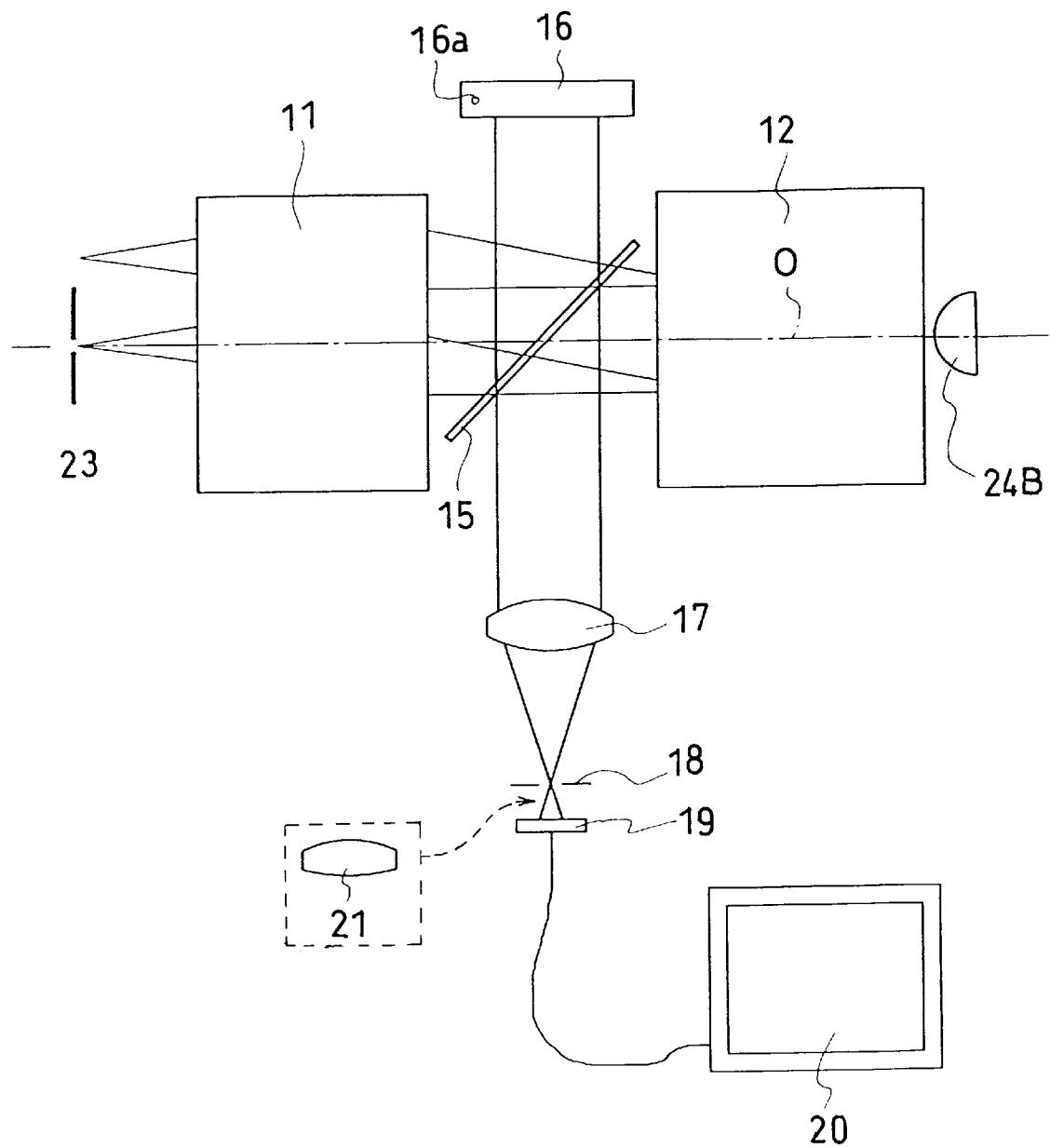
FIG. 4 is a schematic view of a third embodiment of an interferometer in the UV image forming optical system shown in FIG. 1.

In the optical system as mentioned above, the pin-hole plate 23 is located in place of the reticle 13 and the plane mirror 24A, the spherical convex mirror 24B or the spherical concave mirror 24C is located in place of the wafer 14 to form the interferometer, respectively when the collimating lens 11 and the imaging lens 12 are adjusted upon assembly or in use (see, for example, FIGS. 2 through 4). The divergent U radiation passes through the pin-hole of the pin-hole plate 23 and is collimated by the collimating lens 11. Thereafter, the light is partly reflected by the parallel plate 15 before reaching the reference mirror 16. The light is then reflected by the reference mirror 16 and is transmitted through the parallel plate 15 toward the condenser lens 17. The light emitted from the collimating lens 11 and transmitted through the parallel plate 15 is transmitted through the imaging lens 12 and reflected by the plane mirror 24A, the spherical convex mirror 24B or the spherical concave mirror 24C. Thereafter, the light is transmitted again through the imaging lens 12 and reaches the parallel plate 15 which reflects the light toward the condenser lens 17. Consequently, the interference fringes are produced by the interference of the two light fluxes. The interference fringes can be viewed through the TV monitor 20 to measure the wavefront aberration of the imaging lens 12. The adjustment is effected such that the wavefront aberration is minimized. In the case that the plane mirror 24A is used, since the point of the imaging lens 12 at which the light going in the direction towards the plane mirror 24A passes and the point of the imaging lens 12 at which the light returning away from the plane mirror 24A passes are symmetrical, with respect to the optical axis O, comatic aberration, which is an odd-number order aberration for the pupil of the imaging lens 12, is not detected (included). Consequently, a spherical aberration, a curvature of field, or a defocus can be easily detected. Since the spherical convex mirror 24B and the spherical concave mirror 24C can detect all aberrations, aberrations at each point of the image surface, including the on-axis and off-axis aberrations can be measured.

Upon adjusting the imaging lens 12, the plane mirror 24A is used to measure the on-axis spherical aberration. Thereafter, the plane mirror 24A is replaced by the spherical convex mirror 24B or the spherical concave mirror 24C to measure the on-axis off-center comatic aberration to carry out the adjustment. The off-axis aberration is effected by moving the pin-hole plate 23, the spherical convex mirror 24B or the spherical concave mirror 24C and the spatial filter 18 in the direction perpendicular to the optical axis direction O, and by rotating the reference mirror 16 about the shaft 16a. Namely, when the off-axis aberration is detected, the spherical convex mirror 24B or the spherical concave mirror 24C is moved in association with the movement of the pin-hole plate 23, so that the point where the condenser lens converges the light is moved. The spatial filter 18 is also moved to meet the pin hole of the pin-hole plate 23. The measurements and adjustments of the off-axis comatic aberration and curvature of field are carried out such that the two coherent lights made incident upon the condenser lens 17 are always made substantially parallel by the adjustment of the reference mirror 16. Thereafter, the spherical aberration, which varies during the adjustments of the off-axis aberrations, is adjusted again.

The distribution of the quantity of light can be monitored by the video camera 19 which selectively receives one of either the light transmitted through the collimating lens 11 or the return light reflected by the imaging lens 12 through the spatial filter 18 to thereby check the emission (oscillation) of the UV laser. To this end, the direction of the emission of the light transmitted through the collimating lens 11 and the direction of the emission of the return light reflected by the imaging lens 12 are made different from each other by the adjustment of the angle of the reference mirror 16 which reflects the light reflected by the parallel plate 15.

As mentioned above, the center of curvature of the spherical convex mirror 24B or the spherical concave mirror 24C must be located on the focal plane of the imaging lens 12 to measure the off-axis aberrations. The movement of the spherical convex mirror 24B or the spherical concave mirror 24C is carried out by an existing mechanism which is provided in the stepper, to repeatedly expose the wafer.

If the back focal distance of the imaging lens 12 is sufficiently long, a hemispherical convex lens 24B which is obtained by correctly splitting a sphere into two halves is preferably used. When the split surface of the hemispherical convex mirror 24B is used in place of the surface of the wafer, the center of curvature of the hemispherical convex mirror 24B is automatically located in place of the photosensitive surface of the wafer. Thus, the defocus (out of focus) amount can be easily detected.

After the adjustment of the imaging lens 12 has been completed, the pin-hole plate 23 is replaced with the reticle 13, and the plane mirror 24A, the spherical convex mirror 24B or the spherical concave mirror 24C is replaced with the wafer 14, so that a reduced size of image of the reticle 13 can be projected onto the wafer 14. Upon projecting the reduced image, the light reflected from the is wafer 14 reaches the parallel plate 15 through the imaging lens 12. Thereafter, the light is reflected by the parallel plate 15 and is made incident upon the video camera 19, through the reference mirror 16. The reflected light contains position data regarding the imaging lens 12, i.e., data which represents whether or not the photosensitive surface of the wafer 14 is correctly located at the focal point of the imaging lens 12. Thus, the imaging lens 12 is moved in accordance with the position data to execute the focus adjustment. In the present invention, the focus can be adjusted by the movement of the imaging lens 12 only, and magnification does not change during the focus adjustment.

Figure 6:
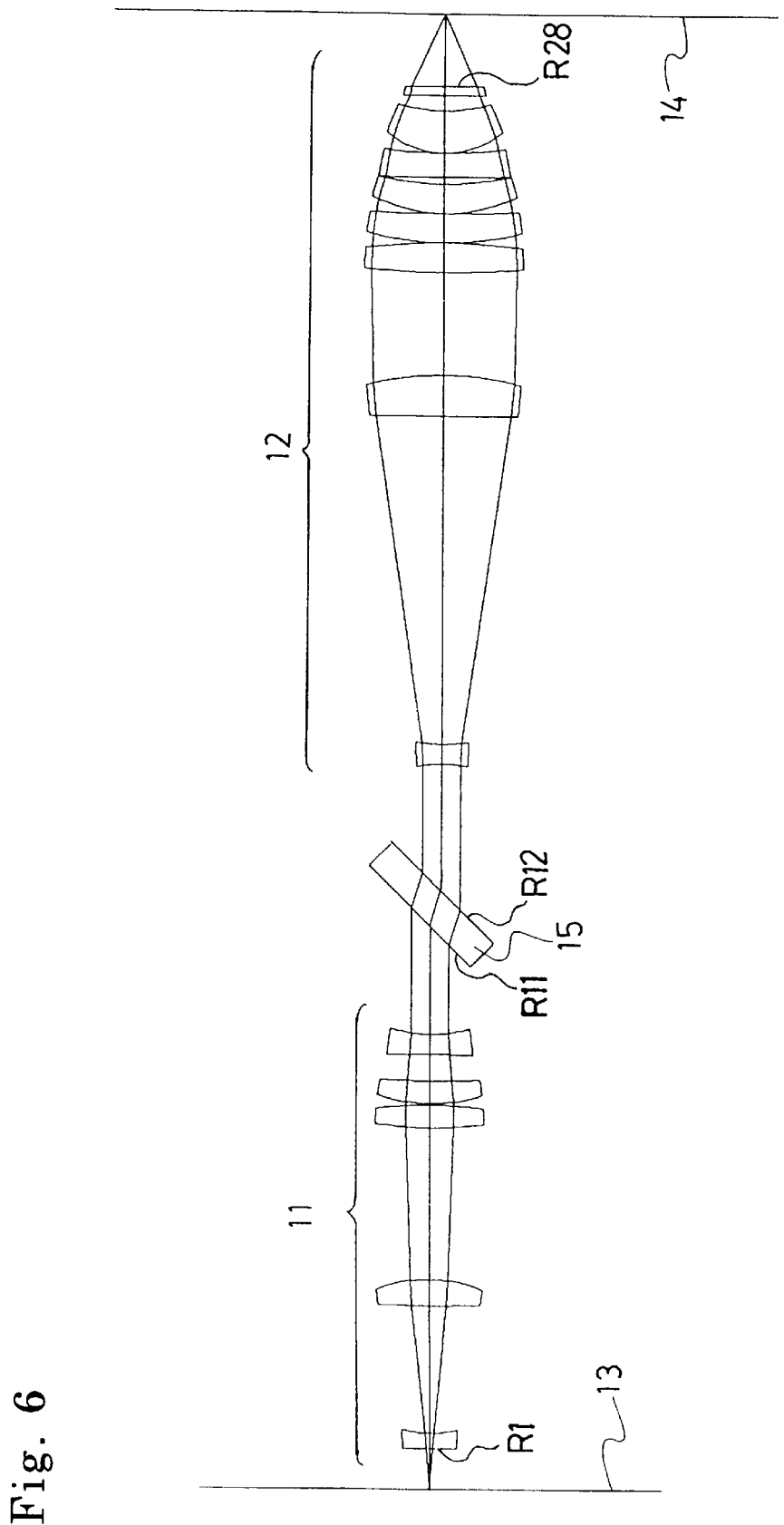

An embodiment of a lens arrangement including the collimating lens 11, the imaging lens 12 and the substantially parallel-plane plate 15 will be discussed below, with reference to FIG. 6. In the embodiment illustrated in FIG. 6, the collimating lens 11 is comprised of five lenses and, the imaging lens 12 is comprised of eight lenses, respectively. Numerical data of the lens system is shown in Table 1 below.

In the table and drawings, "f" designates the focal length, "NA" designates the numerical aperture; "M" the lateral magnification; "$f_B$" the back focal distance, "$\phi$" the diameter of the image circle, "R" the radius of curvature of each lens surface, "D" the lens thickness or the distance between the lenses, and "N (266 nm)" the refractive index at the wavelength of 266 nm, respectively.

TABLE 1 f = 13.017
NA = 0.40
M = −0.200
$f_B$ = 22.469
$\phi$ = 2.00

| Surface No. | R | D | N (266 nm) |
| --- | --- | --- | --- |
| 1 | 196.343 | 5.000 | 1.4997 |
| 2 | 31.282 | 38.980 | — |
| 3 | 1148.125 | 8.000 | 1.4997 |
| 4 | −44.200 | 45.940 | — |
| 5 | 117.274 | 7.000 | 1.4997 |

TABLE 1-continued f = 13.017
NA = 0.40
M = −0.200
$f_B$ = 22.469
φ = 2.00

| Surface No. | R | D | N (266 nm) |
|---|---|---|---|
| 6 | −126.500 | 0.530 | — |
| 7 | 48.884 | 6.900 | 1.4997 |
| 8 | 330.000 | 8.300 | — |
| 9 | −275.000 | 6.000 | 1.4997 |
| 10 | 35.849 | 33.000 | — |
| 11* | ∞ | 10.000 | 1.4997 |
| 12* | ∞ | 36.000 | — |
| 13 | −33.912 | 6.000 | 1.4997 |
| 14 | 52.000 | 99.820 | — |
| 15 | 3000.000 | 12.880 | 1.4997 |
| 16 | −88.800 | 0.000 | — |
| stop | ∞ | 31.810 | — |
| 17 | 275.000 | 9.000 | 1.4997 |
| 18 | −193.485 | 0.100 | — |
| 19 | 92.741 | 9.000 | 1.4997 |
| 20 | 485.000 | 0.100 | — |
| 21 | 50.501 | 9.000 | 1.4997 |
| 22 | 96.650 | 2.200 | — |
| 23 | 1520.979 | 7.400 | 1.4997 |
| 24 | 130.320 | 0.100 | — |
| 25 | 26.525 | 12.500 | 1.4997 |
| 26 | 46.311 | 5.000 | — |
| 27 | ∞ | 2.530 | 1.4997 |
| 28 | ∞ | — | — |

*denotes a parallel plate tilted at 45 degrees with respect to an optical axis.

Shift amount "t" between the optical axes of the collimating lens 11 and the imaging lens 12 equals 3.290 mm.

As may be understood from the above discussion, according to the present invention, since a UW image forming optical system is comprised of a collimating lens, an imaging lens, and a beam splitting optical system provided in the collimated light between the collimating lens and the imaging lens, it is possible to form an interferometer in the image forming optical system. Consequently, the adjustment or measurement of the optical performance can be easily effected during the assembling operation or in use.

What is claimed is:

1. A UV image forming optical system having au image projection mode during which a point on a reticle is imaged as a point on a photosensitive member, and an adjusting mode during which aberrations in said system are measured, said UV image forming optical system comprising:
   a collimating optical system through which a bundle of rays from a point on side reticle is collimated into a parallel bundle of rays;
   an imaging optical system that images said collimated bundle of rays, transmitted through said collimating optical system, onto said photosensitive member;
   a beam splitting system positioned along an optical path between said collimating optical system and said imaging optical system said beam splitting system comprising a beam splitter;
   said UV image forming optical system including, during said adjusting mode, an interferometer in which a collimated bundle of rays emitted from said collimating optical system, reflected by said beam splitter and further reflected by a reference mirror, interferes with a bundle of rays transmitted through said beam splitter, transmitted through said imaging optical system, reflected by a reflecting member, which replaces the photosensitive member, and transmitted back through said imaging optical system to form interference fringes, which includes the aberration information, said reflecting member being positioned at a location where said photosensitive member is positioned during said image projection mode;
   wherein, during said adjusting mode, said photosensitive member is removed and is replaced by said reflecting member, said reflecting member comprising one of a spherical reflecting member having a center of curvature located on a focal plane of said imaging optical system, and a reflecting surface located on said focal plane of said imaging optical system, for measuring different types of aberrations.

2. The UV image forming optical system according to claim 1, further comprising;
   a light gathering lens for gathering interfered light beam from said interferometer; and
   a spatial filter located in the vicinity of a rear focal point of said light gathering lens.

3. The UV image forming optical system according to claim 2, further comprising an adjusting viewing lens, so that a focal point of said light gathering lens coincide with an image pickup surface of a video camera.

4. The UV image forming optical system according to claim 2, wherein said beam splitter comprises a substantially parallel-plane plate which is positioned between said reference mirror and said light gathering lens; and
   wherein said substantially parallel-plane comprises a semi-transparent surface and an anti-reflection surface, and is positioned at a predetermined inclination angle with respect to said optical path.

5. The UV image forming optical system according to claim 4, wherein order to compensate for a parallel-shift of the optical axis in front of and behind said substantially parallel-plane plate caused by said predetermined inclination angle of said parallel plane plate, the optical axis of said imaging optical system is deviated from the optical axis of said collimating optical system by an amount corresponding to said parallel-shift.

6. The UV image forming optical system according to claim 4, wherein said substantially parallel-plane comprises opposed front and rear surfaces which form a wedge with a small inclination angle.

7. The UV image forming optical system according to claim 1, wherein said spherical reflecting member is made moveable while maintaining said center of curvature thereof on said focal plane of said imaging optical system.

8. The UV image forming optical system according to claim 1, wherein during focusing, only said imaging optical system is moved in the optical axis direction thereof, without moving said collimating optical system.

9. The UV image forming optical system according to claim 1, wherein said reference mirror is rotatable so that a direction of said collimated bundle of rays, emitted from said collimating optical system and reflected by said beam splitter, can be varied.

10. The UV image forming optical system according to claim 1, wherein during said adjusting mode, said reticle is replaced by a pinhole plate positioned at the front focal point of said collimating optical system.

11. The UV image forming system according to claim 1, said reflecting surface enabling measurement of spherical aberration and said spherical reflection member enabling measurement of comatic aberration.

12. A UV image forming optical system having an image projection mode during which a point on a reticle is imaged as a point on a photosensitive member, and an adjusting mode, during which aberrations in the system are measured, said UV image forming optical system comprising:

a collimating optical system though which rays from a point are collimated into parallel light rays; and an imaging optical system that, images the parallel light rays from said collimating optical system onto the photosensitive member;

wherein, when said UV image forming optical system is in the adjusting mode, the reticle is replaced by a pinhole plate and the photosensitive member is replaced by one of a plane mirror, a spherical convex mirror, and a spherical concave mirror positioned at a position at which said photosensitive surface is positioned when said UV image forming optical system is in the image projection mode, said UV image forming optical system including in the adjusting mode, an interferometer including a beam splitter, a reference reflector and said imaging optical system so that said imaging optical system can be adjusted in accordance with aberrations measured by said interferometer in said adjusting mode, the plane mirror enabling measurement of spherical aberration, the spherical concave mirror and a spherical convex mirror each enabling measurement of comatic aberration.

13. The UV image forming optical system according to claim 12, wherein off-axis aberration is measured by moving the pin hole plate and one of the plane mirror, the spherical convex mirror and the spherical concave mirror in a direction perpendicular to the optical axis direction.

* * * * *